(12) United States Patent
Marszal et al.

(10) Patent No.: US 10,600,057 B2
(45) Date of Patent: Mar. 24, 2020

(54) EVALUATING A PLACEMENT OF OPTICAL FIRE DETECTOR(S) BASED ON A PLUME MODEL

(71) Applicant: KENEXIS CONSULTING CORPORATION, Upper Arlington, OH (US)

(72) Inventors: Edward Marszal, Upper Arlington, OH (US); Sean Cunningham, Hilliard, OH (US); Kevin Mitchell, Columbus, OH (US)

(73) Assignee: KENEXIS CONSULTING CORPORATION, Upper Arlington, OH (US)

( * ) Notice: Subject to any disclaimer, the term of this patent is extended or adjusted under 35 U.S.C. 154(b) by 317 days.

(21) Appl. No.: 15/429,625

(22) Filed: Feb. 10, 2017

(65) Prior Publication Data
US 2017/0228740 A1    Aug. 10, 2017

Related U.S. Application Data

(60) Provisional application No. 62/293,415, filed on Feb. 10, 2016.

(51) Int. Cl.
*G06Q 30/00* (2012.01)
*G08B 17/103* (2006.01)
(Continued)

(52) U.S. Cl.
CPC ....... *G06Q 30/018* (2013.01); *G06F 17/5004* (2013.01); *G06F 17/5009* (2013.01);
(Continued)

(58) Field of Classification Search
CPC ............... G06Q 30/018; G06Q 10/067; G06F 17/5009; G08B 17/103; G08B 29/185
(Continued)

(56) References Cited

U.S. PATENT DOCUMENTS 4,533,834 A * 8/1985 McCormack ........... F23N 5/082
250/227.11
5,218,345 A * 6/1993 Muller ................. G08B 13/193
340/578

(Continued)

OTHER PUBLICATIONS

Klim Petrov ("Determining the best location of smoke sensor in office room", Mikkeli University of applied sciences, 2012, pp. 1-53) (Year: 2012).*
(Continued)

*Primary Examiner* — Brian S Cook
*Assistant Examiner* — Iftekhar A Khan
(74) *Attorney, Agent, or Firm* — Dickinson Wright PLLC; Charles William Kocher, II

(57) ABSTRACT

The aspects disclosed herein are directed to systems, methods, implementations, and devices for determining if optical fire detector location, orientation, and quantity is sufficient to view a target fraction of all fire scenarios, as determined by risk analysis (e.g., 90%, using an approach that considers the actual dimensions of the visible fire). Employing the aspects disclosed herein, an implementer may review a real-world implementation, or collection of fire detectors including their locations and orientations as determined by heuristics, such as placing fire detectors near potential leak locations, and determine if the proposed layout is capable of detecting the target coverage, or fraction of fire scenarios that are possible in a given situation.

20 Claims, 12 Drawing Sheets

(51) Int. Cl.
*G06Q 10/06* (2012.01)
*G06F 17/50* (2006.01)
*G08B 29/18* (2006.01)

(52) U.S. Cl.
CPC ......... *G06Q 10/067* (2013.01); *G08B 17/103* (2013.01); *G08B 29/185* (2013.01)

(58) Field of Classification Search
USPC .............................................................. 703/6
See application file for complete search history.

(56) References Cited

U.S. PATENT DOCUMENTS

| | | | | |
|---|---|---|---|---|
| 5,734,335 A * | 3/1998 | Brogi | G08B 17/005 | 340/539.25 |
| 5,804,825 A * | 9/1998 | Schuler | G08B 17/12 | 250/339.15 |
| 5,838,242 A * | 11/1998 | Marsden | G08B 17/10 | 340/628 |
| 5,995,008 A * | 11/1999 | King | G08B 17/12 | 340/578 |
| 6,061,141 A * | 5/2000 | Goldenberg | G01N 21/3504 | 356/437 |
| 6,064,064 A * | 5/2000 | Castleman | G08B 17/12 | 250/339.05 |
| 6,078,050 A * | 6/2000 | Castleman | G08B 17/12 | 250/339.15 |
| 6,184,792 B1* | 2/2001 | Privalov | F23N 5/082 | 250/336.1 |
| 6,518,574 B1* | 2/2003 | Castleman | G08B 17/12 | 250/339.05 |
| 7,002,478 B2* | 2/2006 | Moore | G08B 17/125 | 340/522 |
| 7,155,029 B2* | 12/2006 | King | G08B 17/125 | 382/100 |
| 7,327,247 B2* | 2/2008 | Tice | G08B 29/20 | 340/511 |
| 7,541,938 B1* | 6/2009 | Engelhaupt | G08B 17/12 | 250/339.13 |
| 7,609,856 B2* | 10/2009 | Chen | G08B 17/12 | 348/143 |
| 7,649,472 B1* | 1/2010 | Paterno | F21V 33/0076 | 307/116 |
| 7,680,297 B2* | 3/2010 | Privalov | G06K 9/00711 | 340/577 |
| 7,786,877 B2* | 8/2010 | Hou | G08B 17/125 | 340/578 |
| 7,805,002 B2* | 9/2010 | Privalov | G08B 17/103 | 348/82 |
| 8,547,238 B2* | 10/2013 | Harchanko | G08B 17/12 | 340/286.05 |
| 8,689,602 B2* | 4/2014 | Rossiter | G08B 17/113 | 73/1.06 |
| 2002/0160343 A1* | 10/2002 | Ebersole, Jr. | G09B 23/06 | 434/226 |
| 2005/0012626 A1* | 1/2005 | Owrutsky | G08B 17/125 | 340/578 |
| 2005/0154566 A1* | 7/2005 | Farrell | G06F 17/5004 | 703/1 |
| 2008/0252468 A1* | 10/2008 | Mueller | G08B 17/107 | 340/578 |
| 2008/0316039 A1* | 12/2008 | White | G08B 17/103 | 340/630 |
| 2009/0050790 A1* | 2/2009 | Dauler | G01J 1/02 | 250/214 R |
| 2010/0194574 A1* | 8/2010 | Monk | G01N 21/53 | 340/627 |
| 2011/0058037 A1* | 3/2011 | Hanses | G08B 17/125 | 348/143 |
| 2011/0058167 A1* | 3/2011 | Knox | H04N 7/18 | 356/338 |
| 2011/0112660 A1* | 5/2011 | Bergmann | G08B 7/066 | 700/29 |
| 2013/0103362 A1* | 4/2013 | Mather | G06F 17/5004 | 703/1 |
| 2013/0201022 A1* | 8/2013 | Brigham | G08B 17/107 | 340/584 |
| 2013/0241738 A1* | 9/2013 | Kastli | G08B 17/10 | 340/686.4 |
| 2015/0022316 A1* | 1/2015 | Dixon | G08B 25/001 | 340/5.51 |
| 2015/0213697 A1* | 7/2015 | Knox | G08B 17/10 | 382/103 |
| 2015/0371514 A1* | 12/2015 | Bonisch | G08B 17/103 | 340/630 |
| 2015/0379846 A1* | 12/2015 | Bressanutti | G08B 17/107 | 340/630 |
| 2016/0195856 A1* | 7/2016 | Spero | G06N 5/046 | 700/90 |
| 2016/0260306 A1* | 9/2016 | Jackel | G08B 17/005 | |
| 2017/0142539 A1* | 5/2017 | Gallo | H04Q 9/00 | |

OTHER PUBLICATIONS

Robert P. Schifiliti ("Use of Fire Plume Theory in the Design and Analysis of Fire Detector and Sprinkler Response", Worcester Polytechnic Institute, 1986, pp. 1-119) (Year: 1986).*

Liu et al. ("Vision Based Fire Detection", IEEE, 2005, pp. 1-4) (Year: 2005).*

Horng et al. ("A Fast Image-Based Fire Flame Detection Method Using Color Analysis", Tamkang Journal of Science and Engineering, vol. 11, No. 3, pp. 273-285 (2008)) (Year: 2008).*

Liu et al. ("Vision Based Fire Detection",Proceedings of the 17th International Conference on Pattern Recognition (ICPR'04), pp. 1-4) (Year: 2004).*

Toreyin et al. (Computer vision based method for real-time fire and flame detection, Elsevier B.V., 2005, pp. 49-58) (Year: 2005).*

* cited by examiner

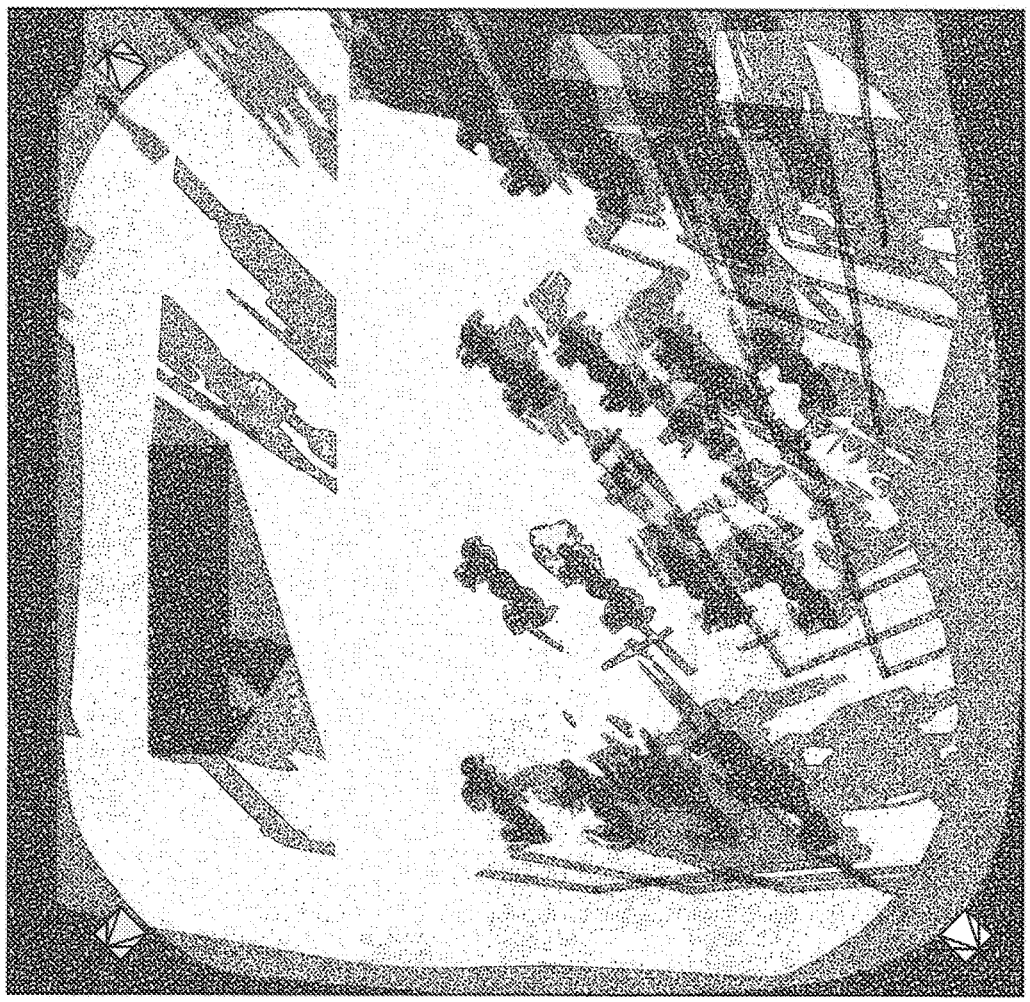
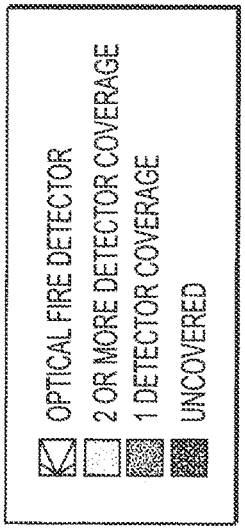
FIG. 10C

EVALUATING A PLACEMENT OF OPTICAL FIRE DETECTOR(S) BASED ON A PLUME MODEL

CROSS-REFERENCE TO RELATED APPLICATIONS

This application claims the benefit of U.S. Provisional Patent Application Ser. No. 62/293,415, filed Feb. 10, 2016, entitled "Creating a Plume Fire Model," which is herein incorporated by reference.

BACKGROUND

Ensuring safe and compliant environments is critical in certain industries and contexts. These requirements may be mandated by laws and regulations with an associated jurisdiction, dictated by customer or insurance requirements, or instituted by the stakeholder's of the environment to ensure safety and prevention of harm to themselves and associates.

One such area associated with said liability is fire and fire-related abatement. Various devices, such as extinguishers, fire sprinkler systems, optical fire detectors, and the like may be implemented. Thus, as a fire is detected, a water or fire abatement system may be instigated, and/or a party associated with remediating the fire may be notified.

In the past, optical fire detectors have been proposed. FIG. 1 illustrates an overview of a top-view of an optical fire detector system implementation according to the prior art.

As shown in FIG. 1, an optical fire detector 110 is provided that is capable of capturing a field of view 120 (or "cone of vision"). Inside the cone 120 is a monitored area 130. The monitored area 130 is the area desired to be monitored by an optical fire detector. This area will be the plane for which coverage results will be calculated. This plane may be parallel to the floor of the room.

In this monitored area 130, it is assumed that a fire 140 (shown as a rectangle for illustrative purposes) is able to be detected by the optical fire detector 110, and the monitored area 130 has 100% coverage.

Thus, the goal of any optical fire detection system is to ensure as much coverage as possible. If an area is not viewable by the optical fire detection system, i.e. if a fire originates in this area and is not detected, the fire may cause costly damage, become dangerously large or uncontainable, or be addressed with too long a delay. Thus, ensuring accurate and complete detection is imperative.

An environment or context employing an optical fire detection system, such as the systems shown in FIGS. 2 and 3, may require multiple systems to be implemented in a single space or room. As will be explained below, an environment or context may include objects that obstruct the vision capabilities of the optical fire detector 110. Thus, in order to deal with these obstructions, multiple optical fire detectors, such as those shown in FIG. 1, may be placed in a variety of locations in a specific environment or context.

Various ideas and simulation software may be proposed to detect whether a system's implementation is sufficient. FIGS. 2 and 3 disclose such techniques, with such techniques being somewhat sufficient in estimating/assessing as to whether the implemented systems are sufficient, or alternatively, need augmentation for improvement (i.e., adding more detectors, re-placing existing detectors, and the like).

Thus, the environment shown in FIG. 1 may be modeled employing three-dimensional computer-aided design (CAD) techniques. Once the environment is modeled, various placements of optical fire detector 110 may be tested and determined to assess adequacy and coverage. Further, the base may be varied to determine how various planes in space are being efficiently captured.

For example, FIG. 2 illustrates a method of optical fire detection employing a cone of vision overlay with two dimension projections of obstructions. In FIG. 2, the optical fire detector 110 is similar to that shown in FIG. 1, and as such, a detailed description will be omitted.

Referring to FIG. 2, the cone 120 illustrated includes a variety of obstructions, 210 and 220. Also shown are rays 230, which are projected from an optical fire detector 110 (or the location where the optical fire detector 110 is implemented). As shown, some of the rays 230 are able to project to the end or boundary of cone 120 (to monitored area 130), while some of the rays 230 are impeded by either obstruction 210 or 220.

Based on the above, a determination is made that the coverage is of X % (for example, as shown, 44%). An implementer may determine that based on the resultant determination, that the coverage associated with a specific placement of an optical fire detector 110 is not sufficient. As such, additional optical fire detectors may be placed and/or the existing optical fire detectors may be re-situated.

FIG. 3 illustrates another example method for determining coverage of an optical fire detection system (known as the point method). In this method, rays are projected from a finite location 330 (end points) inside the monitored area 130 to the placed location of the optical fire detector 110. The end points (shown in monitored area 130) may be configured and spaced by an implementer of the method. As shown, some of the rays 331 are obstructed, while others are not. Once again, based on this determination, an implementer may employ the method to determine the adequacy of coverage of the test optical fire detector 110. FIG. 3 applies to both the ray tracing method and the point method because they will provide the same results. The difference is that ray tracing goes from the detector out to the edge of the cone-of-vision whereas the point method goes from a finite element on the analysis plane back to the detector.

In any implementation, the implementer achieves an advantage in both costs and efficacy when implementing fewer of the systems described above.

SUMMARY

The following description relates to systems, devices, and methods for evaluating placement of optical fire detector(s).

A system for evaluating a placement of an optical fire detector for an environment is described herein. The system includes a data store comprising a computer readable medium storing a program of instructions for the automatic audience creation; a processor that executes the program of instructions, the processor being configured to: receive environment data, the environment data being defined as digital information modeling an environment; retrieve predetermined settings associated with an implementation of the system; receive optical fire detector placement data, the optical fire detector placement data being associated with a placement of an optical fire detector in a location associated with the environment, simulate an area in which the optical fire detector may observe; demarcate the simulated area with a plurality of predetermined plumes; and determine whether the each of the plurality of predetermined plumes is compliant, and outputting a response based on the determination.

In another example, the system includes, demarcating each of the plurality of plumes further into a plurality of facets, each of the plurality of facets being an equal size;

assigning each of the plurality of facets a predetermined radiation amount; wherein the determining of whether each of the plurality of predetermined plumes being compliant is further defined by: determining an amount of the plurality of facets being visible by the optical fire detector; summing the predetermined radiation amount based on the determined amount of the plurality of facets being visible; and the determining of compliance is further defined by the summed predetermined radiation amount being over a predetermined threshold per plume.

In another example, one of the predetermined settings is defined as a plume size.

In another example, one of the predetermined settings is defined as a facet size.

In another example, one of the predetermined settings is defined as an amount of radiation assigned per each of the plurality of facets.

In another example, one of the predetermined settings is defined as a threshold for plume compliance.

In another example, the outputted response is defined as an graphical display indicating which portions of the environment are covered by the optical fire detector being compliant.

In another example, the environment data is sourced by an automatic system to convert a plurality of images of the environment into digital data.

In another example, the environment data is sourced by a manual modelling performed by computer-aided drafting.

Also disclosed herein are systems for evaluating a placement of a plurality of optical fire detectors for an environment. The system includes a data store comprising a computer readable medium storing a program of instructions for the automatic audience creation; a processor that executes the program of instructions, the processor being configured to: receive environment data, the environment data being defined as digital information modeling an environment; retrieve predetermined settings associated with an implementation of the system; receive optical fire detector placement data, the optical fire detector placement data being associated with a placement of the plurality of optical fire detectors in a location associated with the environment, the processor is further configured to perform the following steps: 1) simulate an area in which one of the optical fire detector may observe; 2) demarcate the simulated area with a plurality of predetermined plumes; and 3) determine whether the each of the plurality of predetermined plumes is compliant, 4) iteratively perform steps 1-3 for each of the plurality of optical fire detectors, combine a response based on the determination, and outputting the combined response.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIGS. 10A-10C illustrate an example of outputs employing the system of FIG. 4.

DETAILED DESCRIPTION

Figure 1:
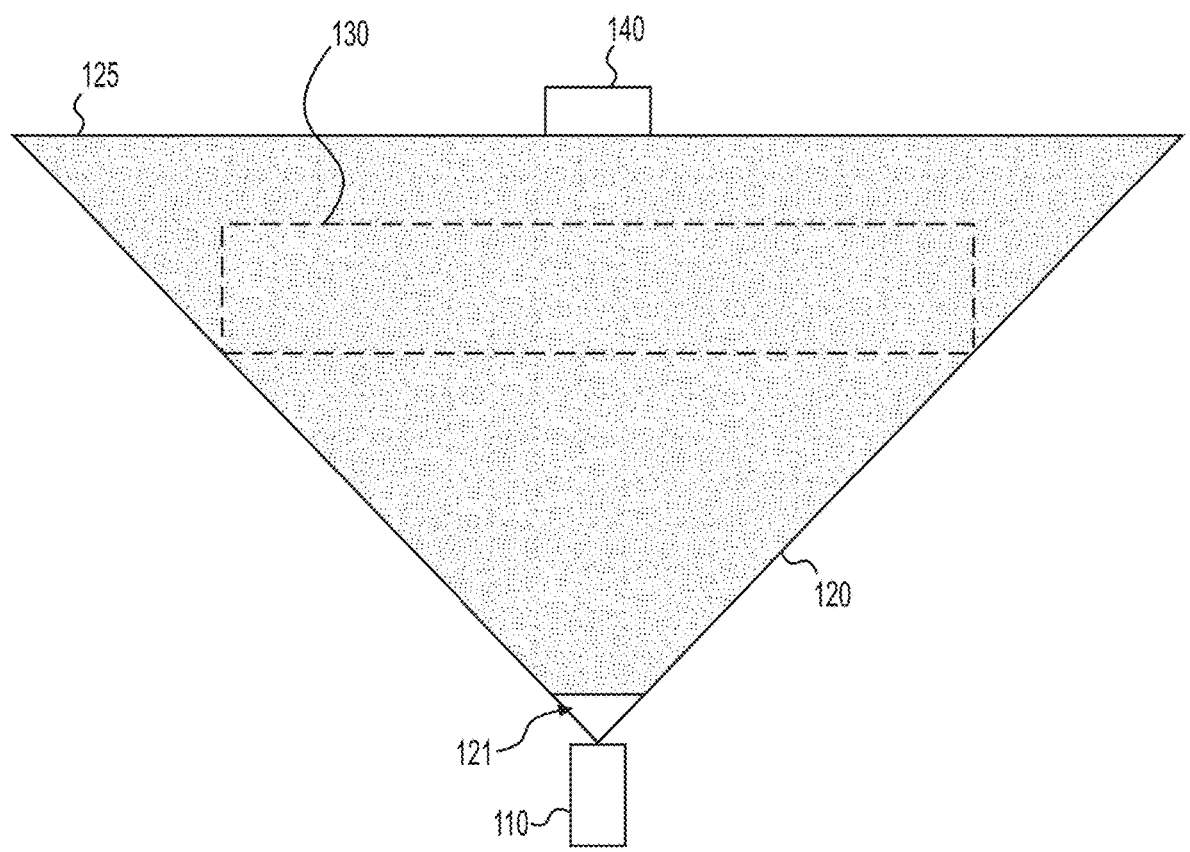
FIG. 1 illustrates an overview of a top-view of an environment in which an optical fire detector system may be implemented.

The invention is described more fully hereinafter with references to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. It will be understood that for the purposes of this disclosure, "at least one of each" will be interpreted to mean any combination the enumerated elements following the respective language, including combination of multiples of the enumerated elements. For example, "at least one of X, Y, and Z" will be construed to mean X only, Y only, Z only, or any combination of two or more items X, Y, and Z (e.g. XYZ, XZ, YZ, X). Throughout the drawings and the detailed description, unless otherwise described, the same drawing reference numerals are understood to refer to the same elements, features, and structures. The relative size and depiction of these elements may be exaggerated for clarity, illustration, and convenience.

As explained above, obtaining an accurate determination of optical fire detector placement allows an implementer of said systems to minimize costs and improve efficacy of placement. Current modeling techniques, such as those shown in FIGS. 2 and 3, employ linear detection systems, either generating a line-of-sight from an optical fire detector or a line-of-sight from various points on an exterior plane of a cone of vision.

Each of these techniques may underreport the capability of the placements being tested. Thus, the determination may be inaccurate or overestimate the lack of coverage.

Disclosed herein are devices, systems, and methods for determining coverage of an optical fire detection system based on a plume model. Employing the aspects disclosed herein, an environment implementing optical fire detectors may realize or achieve a more efficient distribution of the said optical fire detectors.

Figure 4:
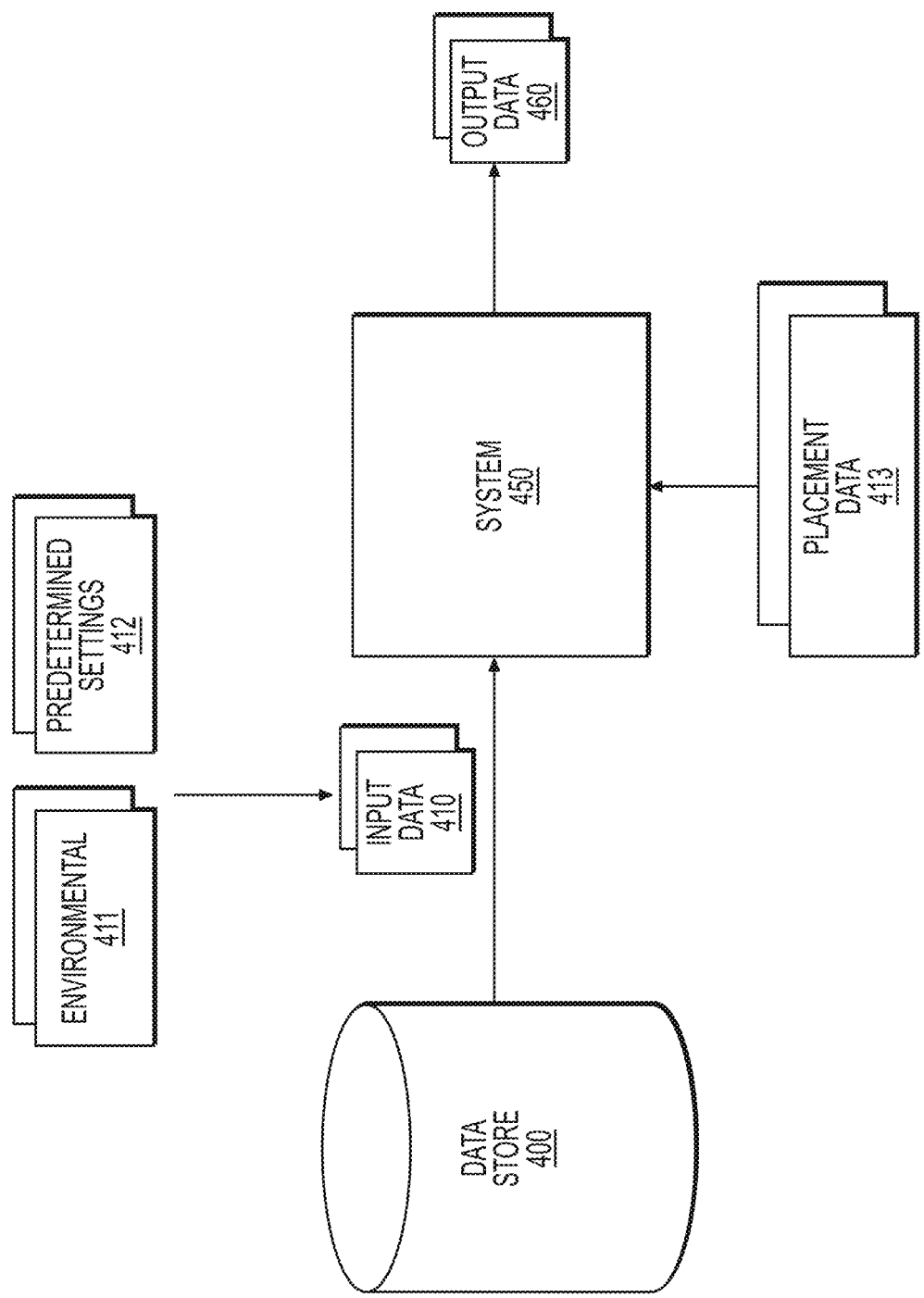
FIG. 4 illustrates a high-level system diagram implementing the aspects disclosed herein.

FIG. 4 illustrates a high-level system diagram implementing the aspects disclosed herein. As shown in FIG. 4, a data store 400 outputs data 410, which is received by system 450, with output 460 indicating a report based on the determination disclosed herein. Output 460 may be either graphical, textual, or a combination thereof. Input data 410 includes at least two items, data 411 associated with an environmental model and predetermined settings 412 that may be either input by an operator or implementer of system 450. Also shown in placement data 413.

The system 450 may be implemented with a processor, or any of the electronic components described herein or known to one of ordinary skill in the art capable of being programmed with instructions to receive data from a sensor and output data indicating efficacy.

The placement data 413 indicates where optical fire detectors are placed, and additionally may contain information about the ability to capture images associated with each optical fire detector.

Figure 5:
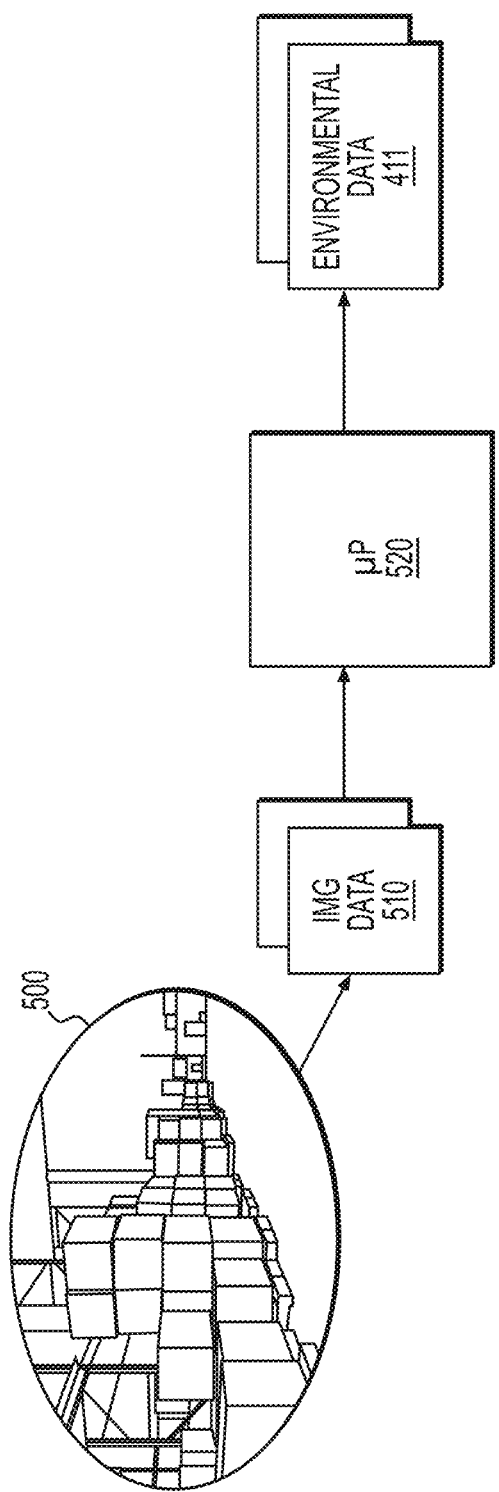
FIG. 5 illustrates one example of producing environment data according to the aspects disclosed herein.

FIG. 5 illustrates one example of producing data 411 according to the aspects disclosed herein. An image 510 (or images) capturing a room 500 is propagated through a processor 520, with the output being a three-dimensional model 411 of the room. Thus, the room 500, various objects in the room 500 may be digitized so a system 450 may enter the various features and objects as coordinates relative to where they are in the room 500.

Additionally, the placement data 413 may be added to indicate where optical fire detectors are situated relative in the room 500. This placement data 413 may employ the same sort of data storage used to digitize and create the three-dimensional model 411. In modeling the optical fire detector(s), various other parameters may be employed in data 413 (or in the predetermined data described in FIG. 7). These items may include size, shape of the cone-of-vision, sensitivity, and orientation angles.

In the example shown above, the data 411 is created automatically through a conversion of a captured image/video into digitized data. Alternatively, an implementer may pre-program or manually create the three-dimensional model 411 employing computer-aided drafting (CAD) techniques known in the art.

As stated above, the system 450 may be a microprocessor configured to execute instructions pre-installed, with data being input from the data shown in FIG. 4, to produce the output 460. Examples of the output 460 will be described in greater detail below.

Figure 6:
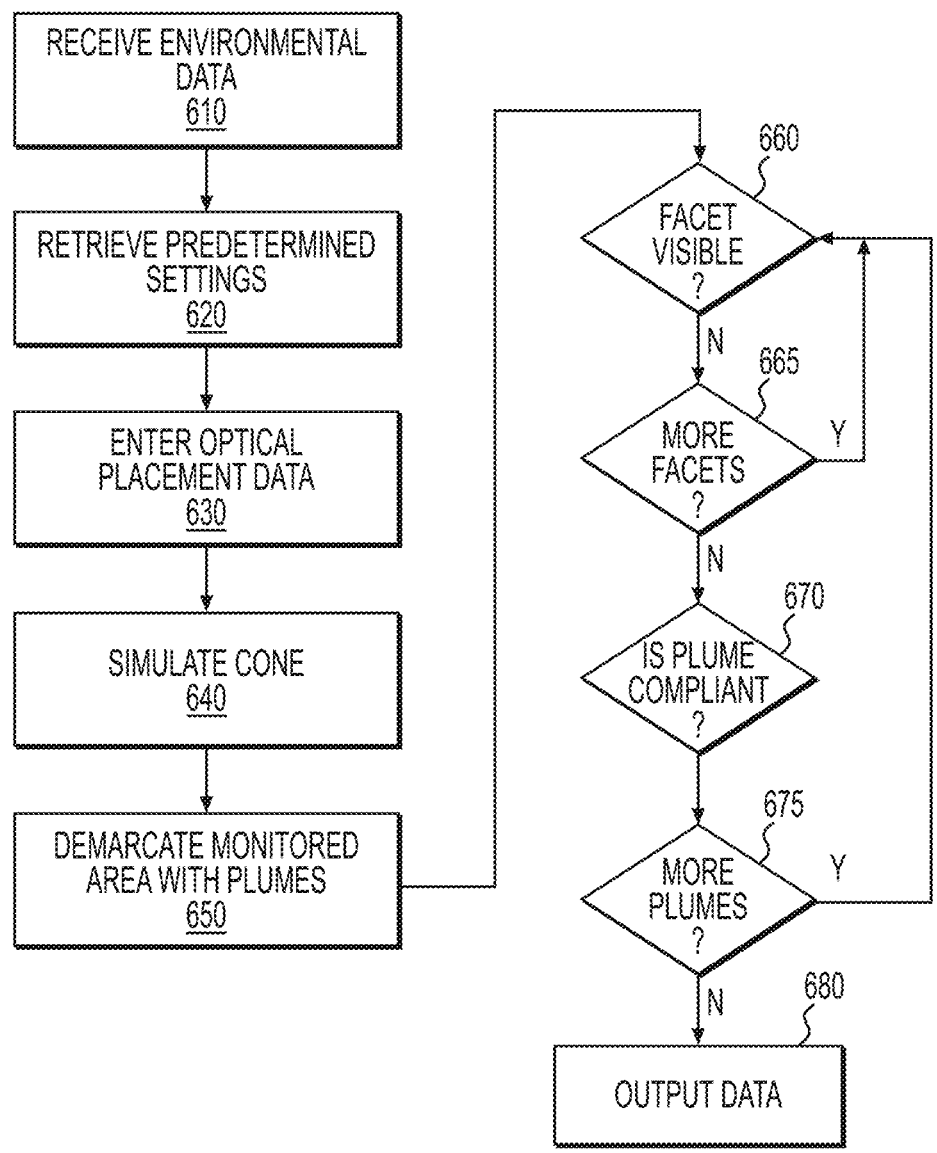
FIG. 6 illustrates a flowchart/method of implementing the system of FIG. 4.

FIG. 6 illustrates a flowchart/method 600 of an example of implementing the aspects disclosed herein. In the flowchart 600, it is presumed the data 411 is provided in any of the ways mentioned above.

In operation 610, the data 411 is received by system 450. The reception of data may occur in any manner that digital data is propagated from a source to a microprocessor, such as through electrical coupling via wired or wireless coupling.

Figure 7:
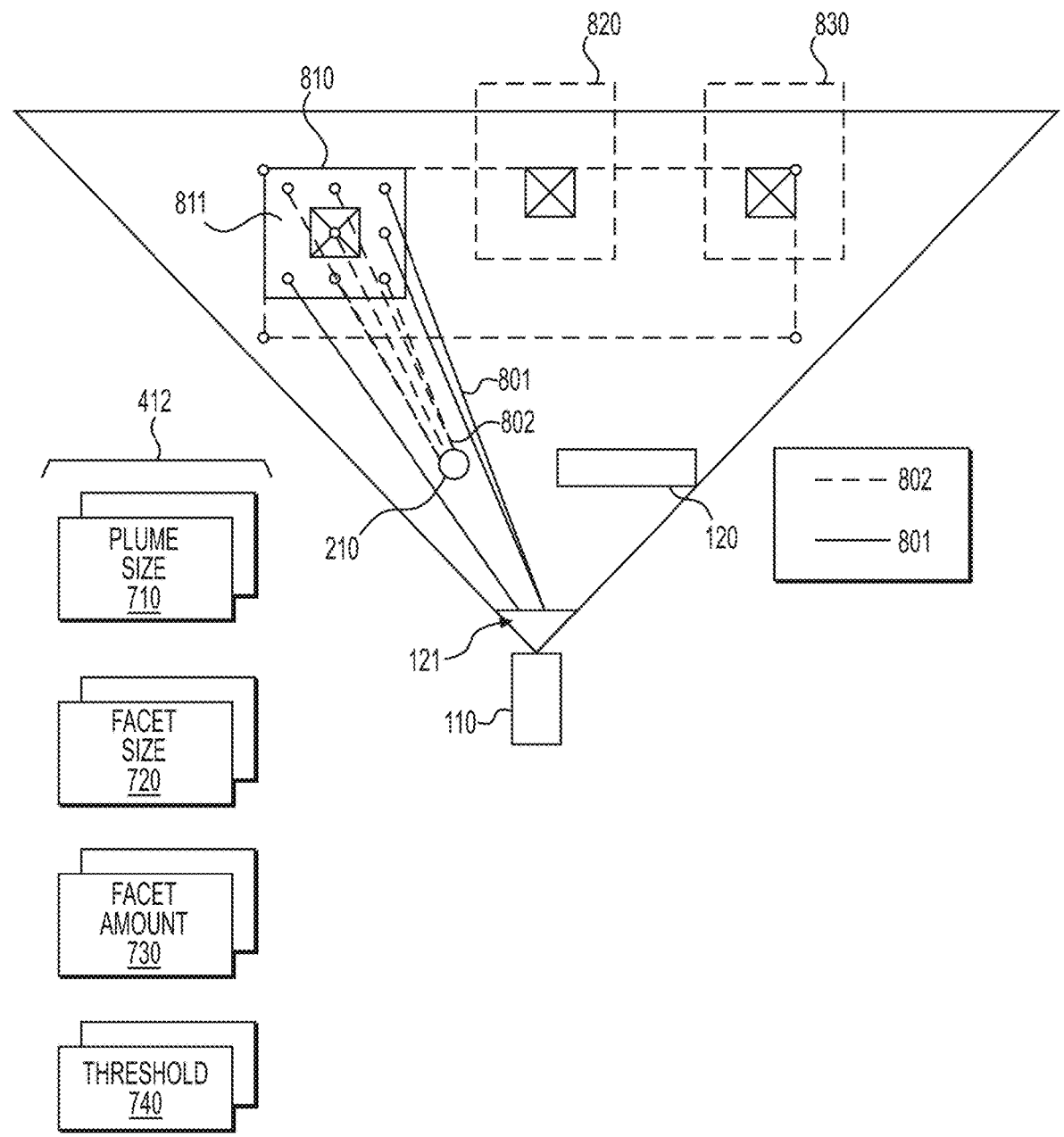
FIGS. 7 and 8 illustrate the plume-model concept.

In operation 620, the predetermined settings 412 are also retrieved. These predetermined settings 412 will be described in greater detail below with the examples shown with the plume-model described herein. FIG. 7 illustrates the plume-model concept, and various of the parameters associated with the plume-model will be described with regards to FIG. 7, and explained in greater detail below.

Figure 2:
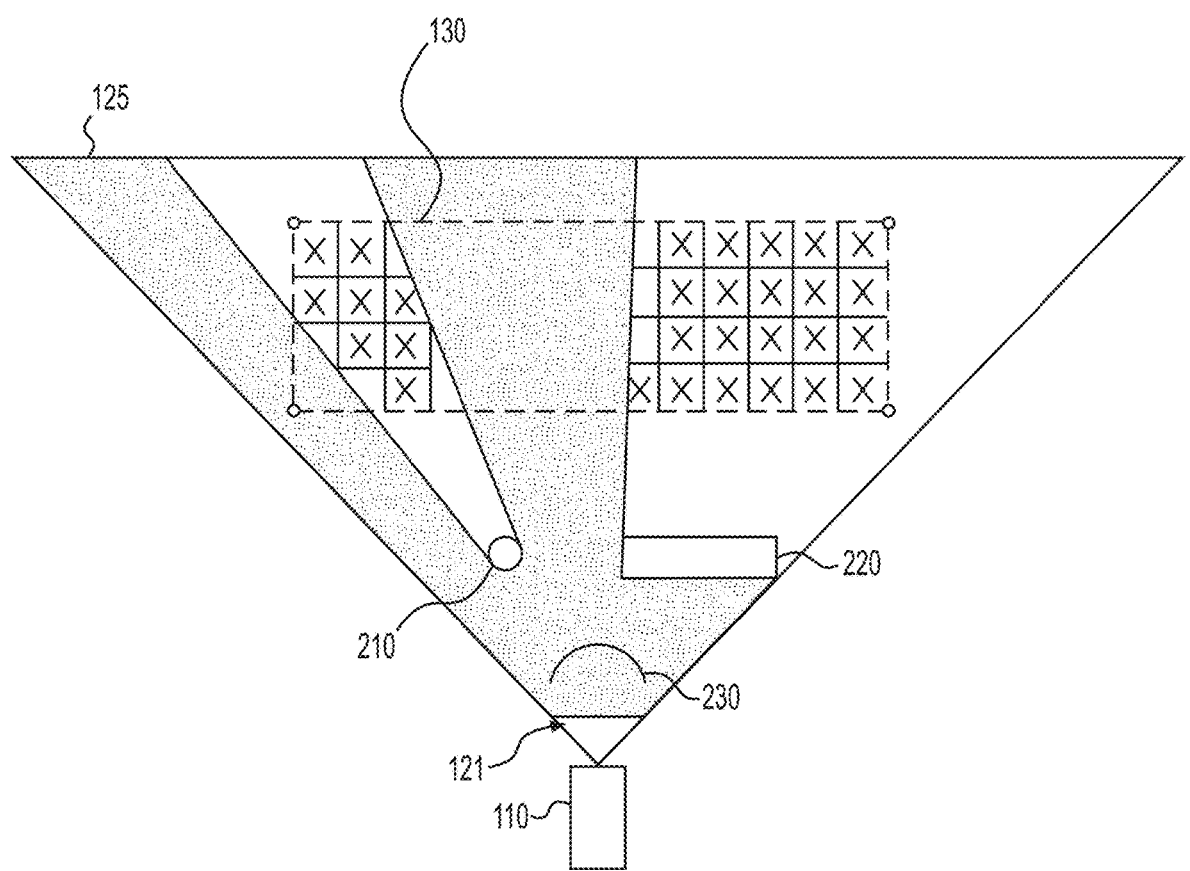
FIG. 2 illustrates a ray tracing method for determining coverage of an optical fire detection system according to the prior art.
Figure 3:
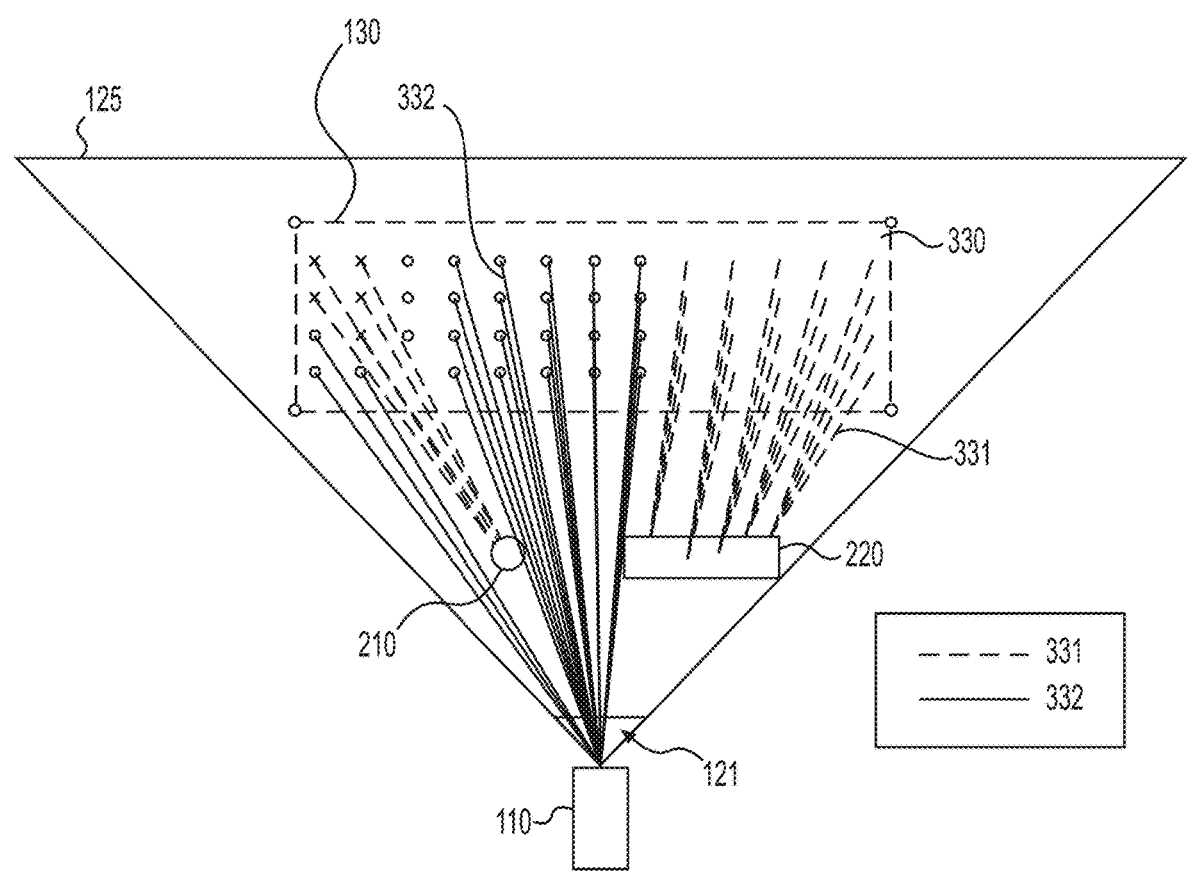
FIG. 3 illustrates a point method for determining coverage of an optical fire detection system according to the prior art.
Figure 8:
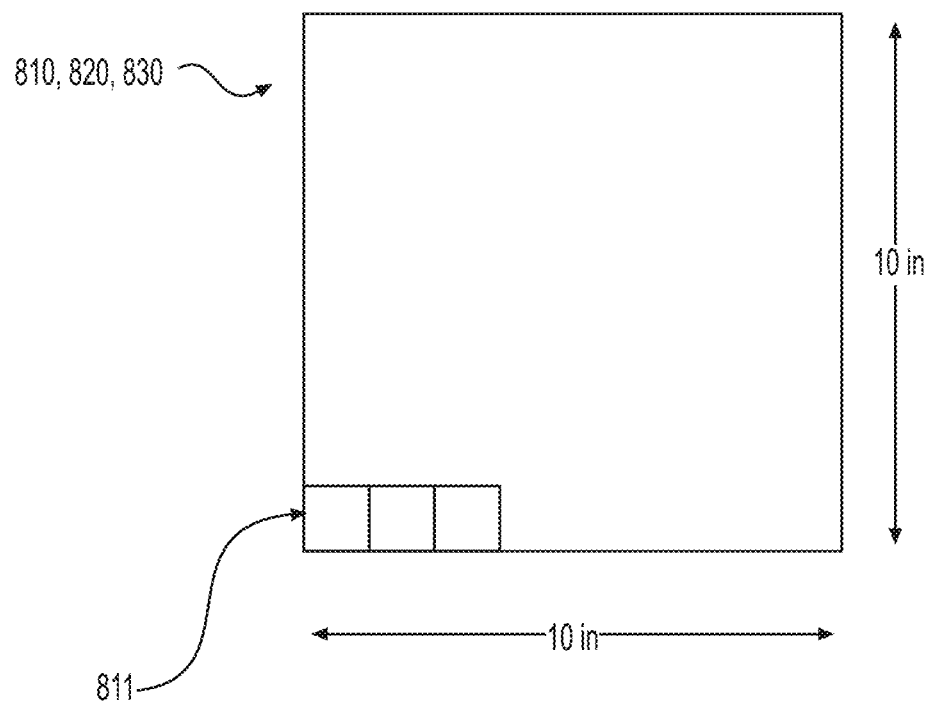

FIG. 7 shows a similar environment to those shown in FIGS. 1-3. However, a key difference is this introduction of a plume. As shown in monitored area 130, the area is demarcated into plumes of various sizes, such as plume 810, 820, and 830. The size of each plume (i.e. the length and width) may be one of the predetermined settings 412 input into system 450. The analysis shown in FIG. 7 implies that the analysis is done over a two-dimensional shape. However, it should be appreciated that the aspects disclosed herein may be implemented with shapes and sizes of different dimensions, such as, but not limited to a three-dimensional cuboid, a cylinder, a cone shape. As such, the plumes may be demarcated to each be a three-dimensional object in space, with the iterative determinations being performed on FIG. 8 illustrates one of the plumes shown in FIG. 7 to highlight and explain the model described herein. Each plume (either plumes 810, 820, and 830) are divided into equal sub-portions ("facets") 811. As shown in FIG. 8, a sample size of 10 inches-by-10 inches is used, with each facet being 1 inch-by-1 inch. This size is merely exemplary, and may be modified based on data submitted with data 413. In the example shown, the facets are of equal size within the plume. In other examples, a variety of sizes of the facets may be pre-entered an configured into the system.

FIG. 7 will also illustrate the concept of the various predetermined settings 412 that may be employed by the system 450. As noted, each plume 810, 820, and 830 may be a specific size to ensure that the whole area covered by the cone 120 is covered. This size may be captured by a plume size setting 710. The size of each facet 720 may also be configured or individually determined as part of the predetermined settings according to an implementer of system 450.

An additional predetermined setting 412 is the amount of radiation 730 that each facet is associated with. In the example shown, the amount of radiation 730 is set at 50 kilowatt. This amount may be set based on an implementer's preference.

The final predetermined setting is the threshold 740, which is used to determine if a plume 810, 820, or 830 is covered by the optical fire detector(s). The threshold 740 will be employed in the method 600 described herein.

Referring back to method 600, in operation 630, placement data 413 is entered into the system 450 via electronic coupling (either through manual inputs or an automatic detection technique). For example, according to the modeling performed in FIG. 5, image/video data of a room or context may detect an optical fire detector 110 situated in a room, and integrate into the electronic data model employed to create data 411.

The placement data 413, as described above, indicates relative to the data 411 where the optical fire detectors are intended to be placed in a room or environment. In the example described herein, the method 600 is employed making a determination for one optical fire detector. However, as will described in greater detail below, various modifications may be employed detecting multiple placements, or alternatively, determining an optimal placement of the optical fire detector(s).

In operation 640, employing data association with the placement data 413 a cone 120 is simulated. A cone 120 creates a three dimensional viewing area of a cone shape, with the monitored area 130 also being created on plane 125 (which is the base of the cone 120—see FIGS. 1-3 for an example). The monitored area 130 serves as a two-dimensional plane replicating the visible area of an image/video capturing device associated with the optical fire detector 110 being associated with the method 600.

In operation 650, the monitored area 130 is demarcated with each plume according to setting 720. Once the plumes are established, the method 600 proceeds to operation 660.

In operations 660 and 665, a determination for a plume is made as to whether each facet in the plume is visible to the optical fire detector 110. As shown in FIG. 7, some of the facets may not be visible to due to various objects (object 210 and 220), and thus, if a fire occurs in those facets, the optical fire detector 110 may not be able to directly see those specific locations. Thus, in operation 660, a single facet is tested to determine visibility with the optical fire detector 110. This determination may be stored in a memory associated with system 450 for further employment by system 450 (or internally saved and stored with memory incorporated in system 450).

In operation 665, the method 600 determines if there are more facets of the plume being tested to perform the operation in 660. If not, the method 600 proceeds to operation 670. If yes, the method 600 iteratively performs operations 660 and 665 until all facets of the plume have been tested.

In operations 670 to 675, each plume is individually determined as to whether it contains enough visible facets that satisfy the threshold associated with predetermined setting 740. This determination may occur by summing each of the facets visible to determine if the summed radiation is over the predetermined threshold. In the examples shown herein, the radiation is summed. However, other factors may be used, such as radiative heat flux, distance from the fire detector, or other metrics employed to determine if a fire is present. Thus, if the plume being determined in 670 is compliant, this information is stored. Alternatively, if is not compliant, this information is also stored. This process occurs iteratively for each plume, until each plume undergoes the operation in 660.

Figure 10A:
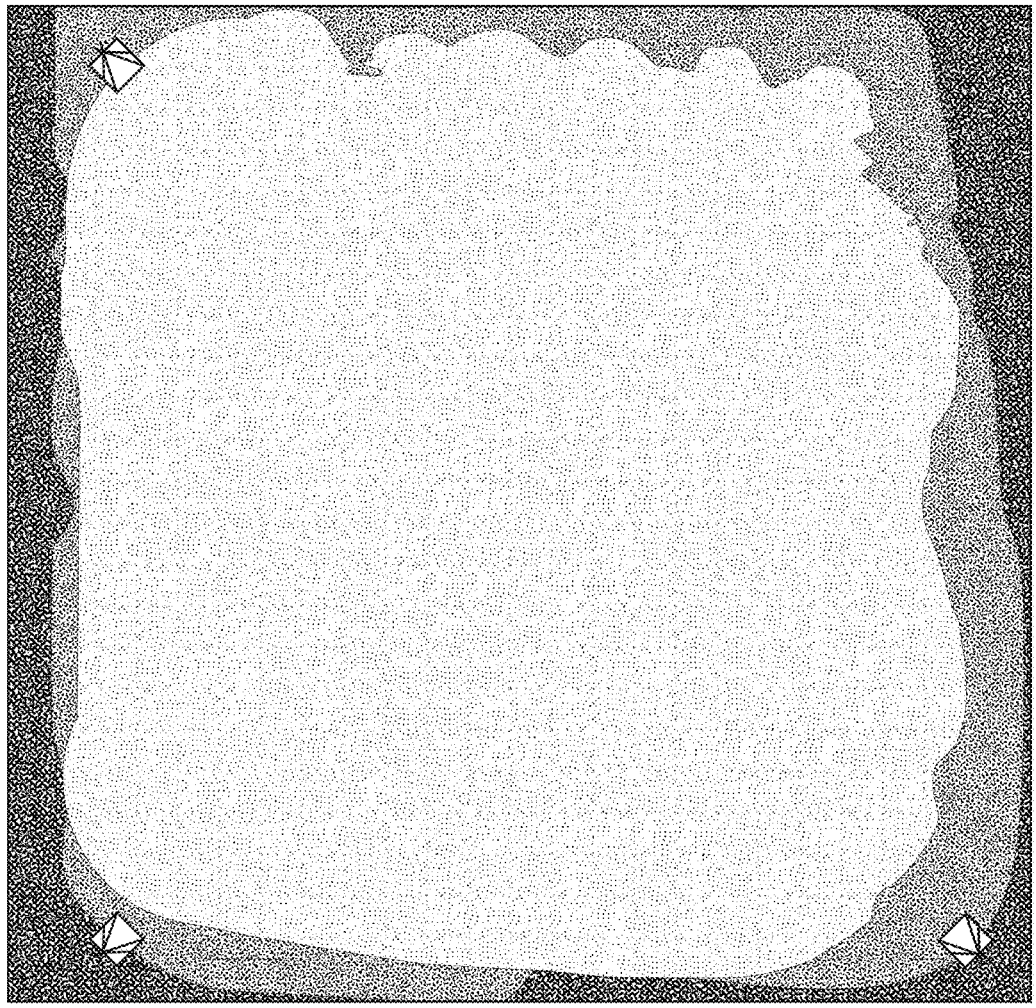
Figure 10B:
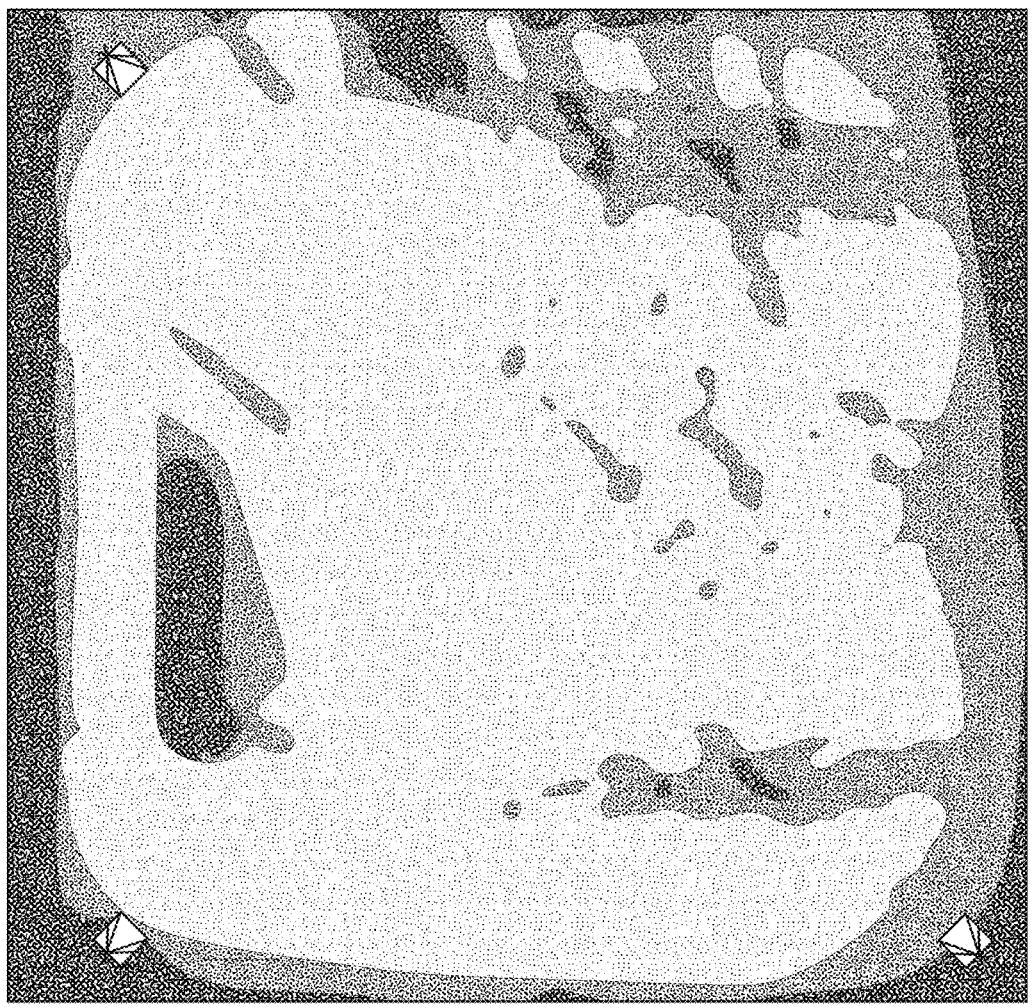

In operation 680, the results of the determination in operation 670 are output. As shown in FIGS. 10(a)-(c), the result of the determination may occur in a variety of manners, such as a single notification as to whether all plumes are compliant or not, a graphical representation (an example will be shown below), and/or a text indication of which plumes fail and by how much under the threshold. The output may be presented as a graphical user interface (GUI), with a user being able to select and expand each plume to indicate which facets are visible and which are not.

Figure 9:
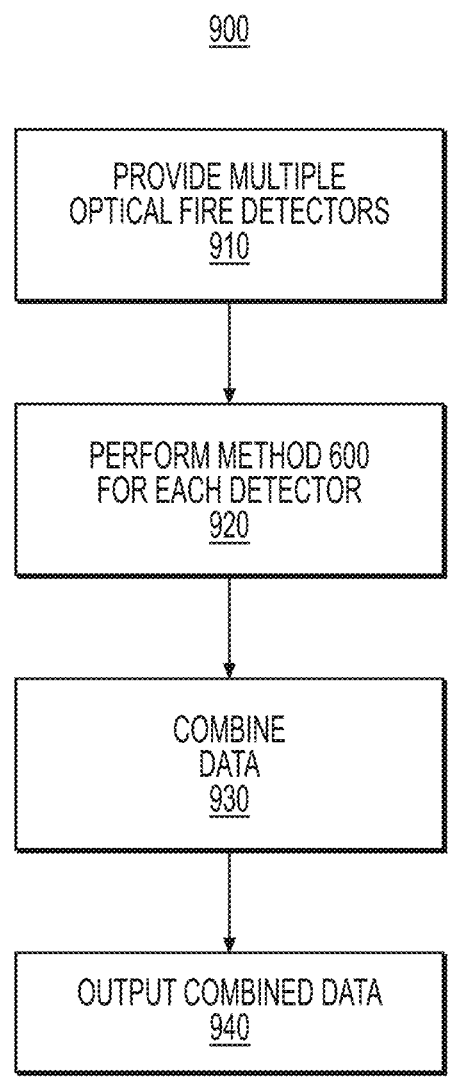
FIG. 9 illustrates a flowchart/method of implementing another embodiment of the system of FIG. 4.

FIG. 9 illustrates a method 900 employing a second embodiment of the aspects disclosed herein. The method 900 may be incorporated into system 450 in a similar manner as described above or in conjunction with any technique employed to instruct a system to perform a series of electronic stimuli to enact a task.

In operation 910, data 413 is provided as above, however, instead of one optical fire detector being situated in an environment, multiple optical fire detectors are situated in said environment. In this way, an implementer of system 450 employing method 900 may determine an optimal placement based on multiple optical fire detectors.

In operation 920, the operations associated with method 600 are iteratively performed for each of the optical fire detectors provided in operation 610. As such, an output indicating the efficacy of each of the optical fire detectors relative to plumes demarcating their zone of coverage are obtained.

In operation 930, the data collected in operation 930 is combined so that every point or coordinate associated with a simulated environment (such as data 411) is measure to see if zero coverage is provided, at least one optical fire detector provides coverage, or if multiple optical fire detectors provide coverage.

In operation 940, the combined data is output. FIGS. 10(a)-(c) provide an example of the outputted data. As such, a key is provided in each of FIGS. 10(a)-(c). FIGS. 10(a) and (b) indicate a sample output for a room or context employing the plume model with different plume sizes. This illustrates that based on an implementers desire for granularity and/or ability to model a fire, that the output data may change accordingly.

In contrast, FIG. 10(c) is a sample output of the same exact environment employing the point model. As shown, the output indicates that the environment requires additional optical fire detectors (based on the lesser coverage). Thus, an implementer of the environment shown in FIGS. 10(a)-(c) will likely require a costlier and more redundant optical fire detector placement strategy.

Certain of the devices shown in FIGS. 4 and 5 include a computing system. The computing system includes a processor (CPU) and a system bus that couples various system components including a system memory such as read only memory (ROM) and random access memory (RAM), to the processor. Other system memory may be available for use as well. The computing system may include more than one processor or a group or cluster of computing system networked together to provide greater processing capability. The system bus may be any of several types of bus structures including a memory bus or memory controller, a peripheral bus, and a local bus using any of a variety of bus architectures. A basic input/output (BIOS) stored in the ROM or the like, may provide basic routines that help to transfer information between elements within the computing system, such as during start-up. The computing system further includes data stores, which maintain a database according to known database management systems. The data stores may be embodied in many forms, such as a hard disk drive, a magnetic disk drive, an optical disk drive, tape drive, or another type of computer readable media which can store data that are accessible by the processor, such as magnetic cassettes, flash memory cards, digital versatile disks, cartridges, random access memories (RAMs) and, read only memory (ROM). The data stores may be connected to the system bus by a drive interface. The data stores provide nonvolatile storage of computer readable instructions, data structures, program modules and other data for the computing system.

To enable human (and in some instances, machine) user interaction, the computing system may include an input device, such as a microphone for speech and audio, a touch sensitive screen for gesture or graphical input, keyboard, mouse, motion input, and so forth. An output device can include one or more of a number of output mechanisms. In some instances, multimodal systems enable a user to provide multiple types of input to communicate with the computing system. A communications interface generally enables the computing device system to communicate with one or more other computing devices using various communication and network protocols.

The preceding disclosure refers to a number of flow charts and accompanying descriptions to illustrate the embodiments represented in FIGS. 6 and 9. The disclosed devices, components, and systems contemplate using or implementing any suitable technique for performing the steps illustrated in these figures. Thus, FIGS. 6 and 9 are for illustration purposes only and the described or similar steps may be performed at any appropriate time, including concurrently, individually, or in combination. In addition, many of the steps in these flow charts may take place simultaneously and/or in different orders than as shown and described. Moreover, the disclosed systems may use processes and methods with additional, fewer, and/or different steps.

Embodiments disclosed herein can be implemented in digital electronic circuitry, or in computer software, firmware, or hardware, including the herein disclosed structures and their equivalents. Some embodiments can be implemented as one or more computer programs, i.e., one or more modules of computer program instructions, encoded on a tangible computer storage medium for execution by one or more processors. A computer storage medium can be, or can be included in, a computer-readable storage device, a computer-readable storage substrate, or a random or serial access memory. The computer storage medium can also be, or can be included in, one or more separate tangible components or media such as multiple CDs, disks, or other storage devices. The computer storage medium does not include a transitory signal.

As used herein, the term processor encompasses all kinds of apparatus, devices, and machines for processing data, including by way of example a programmable processor, a computer, a system on a chip, or multiple ones, or combinations, of the foregoing. The processor can include special purpose logic circuitry, e.g., an FPGA (field programmable gate array) or an ASIC (application-specific integrated circuit). The processor also can include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, module, engine, software, software application, script, or code) can be written in any form of programming language, including compiled or interpreted languages, declarative or procedural languages, and the program can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

To provide for interaction with an individual, the herein disclosed embodiments can be implemented using an interactive display, such as a graphical user interface (GUI). Such GUI's may include interactive features such as pop-up or pull-down menus or lists, selection tabs, scan-able features, and other features that can receive human inputs.

The computing system disclosed herein can include clients and servers. A client and server are generally remote from each other and typically interact through a communications network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

We claim:

1. A system for evaluating a placement of an optical fire detector for an environment, comprising:
a data store comprising a computer readable medium storing a program of instructions for automatic determination of whether or not a plurality of visible volumes of a flaming fire is viewable by the optical fire detector;
a processor that executes the program of instructions, the processor being configured to:
receive environment data, the environment data being defined as digital information modeling the environment;
retrieve predetermined settings associated with an implementation of the system including a predetermined threshold amount of radiation from each of the plurality of visible volumes of the flaming fire;
receive optical fire detector placement data, the optical fire detector placement data being associated with a placement of the optical fire detector in a location associated with the environment,
simulate an area in which the optical fire detector may observe;
demarcate the simulated area with the plurality of visible volumes of the flaming fire representing a portion of the simulated area; and
determine whether the each of the plurality of visible volumes of the flaming fire is compliant,
and output a response based on the determination, wherein one of the plurality of the visible volumes of the flaming fire is compliant when an amount of radiation from a sum of a plurality of predetermined finite volumes whose totality represents a total visible volume of the flaming fire is greater than the threshold amount of radiation.

2. The system according to claim 1, further comprising:
demarcating each of the plurality of visible volumes of the flaming fire further into the plurality of finite volumes;
assigning each of the plurality of finite volumes a predetermined radiation amount;
wherein the determining of whether each of the plurality of predetermined visible volumes of the flaming fire is compliant is further defined by:
determining an amount of the plurality of finite volumes being visible by the optical fire detector;
summing the predetermined radiation amount based on the determined amount of the plurality of finite volumes being visible; and
the determining of compliance is further defined by the summed predetermined radiation amount being over the predetermined threshold amount of radiation from summation of the radiation from of the plurality of finite volumes.

3. The system according to claim 2, wherein one of the predetermined settings is a visible volume of the flaming fire.

4. The system according to claim 2, wherein one of the predetermined settings is defined as a size of one of the plurality of finite volumes.

5. The system according to claim 1, wherein the outputted response is defined as a graphical display indicating which portions of the environment are covered by the optical fire detector being compliant.

6. The system according to claim 1, wherein the environment data is sourced by an automatic system to convert a plurality of images of the environment into digital data.

7. The system according to claim 1, wherein the environment data is sourced by a manual modelling performed by computer-aided drafting.

8. A system for evaluating a placement of a plurality of optical fire detectors for an environment, comprising:
a data store comprising a computer readable medium storing a program of instructions for automatic determination of whether or not a plurality of visible volumes of a flaming fire is viewable by the plurality of optical fire detectors;

a processor that executes the program of instructions, the processor being configured to:

receive environment data, the environment data being defined as digital information modeling an environment;

retrieve predetermined settings associated with an implementation of the system including a predetermined threshold amount of radiation from each of the plurality of visible volumes of the flaming fire;

receive optical fire detector placement data, the optical fire detector placement data being associated with a placement of the plurality of optical fire detectors in a location associated with the environment, wherein the processor is further configured to perform the following steps:
1) simulate an area m which one of the plurality of optical fire detectors may observe;
demarcate the simulated area with the plurality of visible volumes of the flaming fire representing a portion of the simulated area;
3) determine whether the each of the plurality of visible volumes of a flaming fire is compliant, wherein one of the plurality of visible volumes of the flaming fire is compliant when an amount of radiation from the one of the plurality of visible volumes of the flaming fire is greater than the threshold amount of radiation, and
4) iteratively perform steps 1-3 for each of the plurality of optical fire detectors,
combine a response based on the determination, and outputting
the combined response.

9. The system according to claim 8, wherein the simulation of an area in which one of the plurality of optical fire detectors may observe further comprises configuring the processor to:
receive environment data, the environment data being defined as digital information modeling the environment;
retrieve predetermined settings associated with an implementation of the system;
receive optical fire detector placement data, the optical fire detector placement data being associated with a placement of the one of the plurality of optical fire detectors in a location associated with the environment,
simulate an area in which the one of the plurality of optical fire detectors may observe;
demarcate the simulated area with a plurality of visible volumes of a flaming fire; and
determine whether the each of the plurality of visible volumes of the flaming fire is compliant,
and outputting a response based on the determination.

10. The system according to claim 9, further comprising:
demarcating each of the plurality of visible volumes of the flaming fire further into a plurality of finite volumes;
assigning each of the plurality of finite volumes a predetermined radiation amount;
wherein the determining of whether each of the plurality of visible volumes of the flaming fire being compliant is further defined by:
determining an amount of the plurality of finite volumes being visible by the optical fire detector;
summing the predetermined radiation amount based on the determined amount of the plurality of finite volumes being visible; and
the determining of compliance is further defined by the summed predetermined radiation amount being over the predetermined threshold amount of radiation from each of the plurality of visible volumes of the flaming fire.

11. The system according to claim 10, wherein one of the predetermined settings is defined as a plume size of one of the plurality of visible volumes of the flaming fire.

12. The system according to claim 10, wherein one of the predetermined settings is defined as a size of one of the plurality of finite volumes.

13. The system according to claim 10, wherein one of the predetermined settings is defined as an amount of radiation assigned per each of the plurality of facets finite volumes.

14. The system according to claim 10, wherein one of the predetermined settings is defined as a threshold for compliance of one of the plurality of visible volumes of the flaming fire.

15. The system according to claim 9, wherein the outputted response is defined as a graphical display indicating which portions of the environment are covered by the optical fire detector being compliant.

16. The system according to claim 9, wherein the environment data is sourced by an automatic system to convert a plurality of images of the environment into digital data.

17. The system according to claim 9, wherein the environment data is sourced by a manual modelling performed by computer-aided drafting.

18. The system according to claim 8, wherein the outputting further comprises producing a graphical user interface, wherein a number of optical fire detectors covering a spot in the room is associated with a unique color.

19. The system according to claim 1, wherein the determination whether each of the plurality of predetermined visible volumes of the flaming fire is compliant includes a determination of radiative heat flux.

20. The system according to claim 1, wherein the environment data further includes objects disposed between the optical fire detector and the plurality of visible volumes of the flaming fire and affect the visibility of one or more of the plurality of predetermined visible volumes of the flaming fire by the optical fire detector.

* * * * *

UNITED STATES PATENT AND TRADEMARK OFFICE
CERTIFICATE OF CORRECTION

Page 1 of 1

PATENT NO. : 10,600,057 B2
APPLICATION NO. : 15/429625
DATED : March 24, 2020
INVENTOR(S) : Edward Marszal, Sean Cunningham and Kevin Mitchell It is certified that error appears in the above-identified patent and that said Letters Patent is hereby corrected as shown below:

In the Claims

| Column | Line | |
|---|---|---|
| 10 | 25 | "the" should be deleted |
| 10 | 27 | "predetermined" should be deleted |
| 10 | 36 | "predetermined" should be deleted |
| 11 | 19 | "m" should read "in" |
| 12 | 19 | "plume" should be deleted |
| 12 | 26 | "facets" should be deleted |
| 12 | 46 | "predetermined" should be deleted |
| 12 | 54 | "predetermined" should be deleted |

Signed and Sealed this
Eleventh Day of August, 2020

Andrei Iancu
*Director of the United States Patent and Trademark Office*